US 9,341,958 B2

(12) United States Patent
Enkisch et al.

(10) Patent No.: US 9,341,958 B2
(45) Date of Patent: May 17, 2016

(54) DEFLECTION MIRROR AND PROJECTION EXPOSURE APPARATUS FOR MICROLITHOGRAPHY COMPRISING SUCH A DEFLECTION MIRROR

(71) Applicant: CARL ZEISS SMT GmbH, Oberkochen (DE)

(72) Inventors: Hartmut Enkisch, Aalen (DE); Stephan Muellender, Aalen (DE); Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 193 days.

(21) Appl. No.: 14/032,724

(22) Filed: Sep. 20, 2013

(65) Prior Publication Data

US 2014/0022525 A1 Jan. 23, 2014

Related U.S. Application Data

(63) Continuation of application No. PCT/EP2012/054752, filed on Mar. 19, 2012.

(60) Provisional application No. 61/466,199, filed on Mar. 22, 2011.

(30) Foreign Application Priority Data

May 10, 2011 (DE) .......................... 10 2011 075 579

(51) Int. Cl.
  *G03B 27/54* (2006.01)
  *G03F 7/20* (2006.01)
  *G02B 17/06* (2006.01)
  *G21K 1/06* (2006.01)
  *B82Y 10/00* (2011.01)

(52) U.S. Cl.
  CPC ................. *G03F 7/702* (2013.01); *B82Y 10/00* (2013.01); *G02B 17/06* (2013.01);

(Continued)

(58) Field of Classification Search
  CPC . G03F 7/70191; G03F 7/702; G03F 7/70308; G03F 7/70316; B82Y 10/00; G02B 17/06; G02B 17/0663; G21K 1/062; G21K 2201/061; G21K 2201/067
  USPC .......................................................... 355/67
  See application file for complete search history.

(56) References Cited

U.S. PATENT DOCUMENTS

2003/0222225 A1   12/2003   Shiraishi
2004/0121134 A1*   6/2004   Bijkerk et al. ................ 428/212

(Continued)

FOREIGN PATENT DOCUMENTS

DE   102009017095 A1   10/2010
DE   102009029471 A1   3/2011

OTHER PUBLICATIONS

Office Action in corresponding Taiwanese Application No. 101109461, dated Jun. 30, 2014, along with an English translation.

(Continued)

*Primary Examiner* — Peter B Kim

(74) *Attorney, Agent, or Firm* — Edell, Shapiro & Finnan, LLC

(57) ABSTRACT

A deflection mirror (1, 501, etc.) for a microlithography projection exposure apparatus for illuminating an object field in an object plane of the projection exposure apparatus (1067) using the deflection mirror with grazing incidence. This deflection mirror has a substrate (3, 503, etc.) and at least one layer system (5, 505, etc.), and during operation light impinges on said mirror at a multiplicity of angles of incidence, wherein the layer system is designed such that, for light having a wavelength of less than 30 nm, for an angle of incidence of between 55° and 70°, the variation of the reflectivity is less than 20%, in particular less than 12%.

20 Claims, 14 Drawing Sheets

(52) U.S. Cl.
CPC ....... *G02B 17/0663* (2013.01); *G03F 7/70191* (2013.01); *G03F 7/70308* (2013.01); *G03F 7/70316* (2013.01); *G21K 1/062* (2013.01); *G21K 2201/061* (2013.01); *G21K 2201/067* (2013.01)

(56) References Cited

U.S. PATENT DOCUMENTS

| | | | |
|---|---|---|---|
| 2008/0165415 A1* | 7/2008 | Chan | G02B 5/0891 359/351 |
| 2009/0097104 A1 | 4/2009 | Kandaka et al. | |
| 2010/0027107 A1 | 2/2010 | Yakshin et al. | |
| 2010/0195075 A1 | 8/2010 | Chan et al. | |
| 2010/0284511 A1 | 11/2010 | Zocchi et al. | |
| 2012/0134015 A1 | 5/2012 | Paul et al. | |
| 2012/0229784 A1 | 9/2012 | Rocktaeschel et al. | |

OTHER PUBLICATIONS

International Search Report in counterpart International Application No. PCT/EP2012/054752, mailed Jul. 17, 2012.

English translation of Office Action in corresponding German Application No. 10 2011 075 579.9, mailed Jan. 31, 2012.

* cited by examiner

US 9,341,958 B2

DEFLECTION MIRROR AND PROJECTION EXPOSURE APPARATUS FOR MICROLITHOGRAPHY COMPRISING SUCH A DEFLECTION MIRROR

The present application is a Continuation of International Application No. PCT/EP2012/054752, filed on Mar. 19, 2012, which claims priority of German Patent Application No. 10 2011 075 579.9, filed on May 10, 2011, and U.S. Provisional Application No. 61/466,199, filed on Mar. 22, 2011. The disclosures of these three applications are hereby incorporated herein by reference in their respective entireties.

FIELD OF AND BACKGROUND OF THE INVENTION

The invention relates to a deflection mirror. Furthermore, the invention relates to a projection exposure apparatus for use in microlithography comprising such a deflection mirror.

Projection exposure apparatuses for microlithography for the EUV wavelength range rely on the mirrors used having a high reflectivity since, firstly, the product of the reflectivity values of the individual mirrors determines the total transmission of the projection exposure apparatus and since, secondly, EUV light sources are limited in terms of their light power.

Mirrors for the EUV wavelength range having high reflectivity values are known from DE 101 55 711 A1, for example. The mirrors described therein consist of a layer system applied on a substrate and having a sequence of layers. Such mirrors having a layer system (so-called multilayer) are generally operated with virtually normal incidence, i.e. at angles of incidence of between 0° and 45°. With virtually grazing incidence, i.e. at angles of incidence of between 45° and 90°, by contrast, mirrors having a single layer are generally used, said single layer consisting of a metal.

In order to increase the reflectivity for angles of incidence in the transition range between normal incidence and grazing incidence in the case of mirrors having predominantly grazing incidence, therefore, mirrors are known which combine a multilayer with a single layer. In this case, the mirrors are divided into discrete zones. In each of said zones, one of the coatings mentioned can be used. Such mirrors are described as collector mirrors for an EUV light source, for example, in US2010/0284511. The disadvantage of these collector mirrors, however, is that each zone is coated with a dedicated layer system having a homogeneous thickness. This leads to a rising and subsequent falling of the reflectivity in each zone. At the connection locations of the zones, local minima arise in the reflectivity curve, which, although they are insignificant for the use of such a mirror as a collector mirror, nevertheless for the use of such a mirror as a deflection mirror at the end of an illumination optical unit directly upstream of the mask of a projection exposure apparatus they lead to a non-tolerable intensity fluctuation on the mask. Furthermore, a coating in zones is complicated to carry out since in each case only one zone is to be coated. The other zones in this case have to be protected e.g. by covers.

OBJECTS AND SUMMARY OF THE INVENTION

The object of the present invention, therefore, is to provide a deflection mirror for an illumination optical unit of an EUV microlithography projection exposure apparatus which enables homogeneous illumination of the mask of a projection exposure apparatus.

According to the invention, this object is achieved by a deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, and wherein the layer system is designed such that, for light having a wavelength of less than 30 nm and for angles of incidence of between 55° and 70°, the variation of the reflectivity is less than 20%, in particular less than 12%.

By virtue of the fact that the deflection mirror according to the invention has such a low variation of the reflectivity, the light distribution incident on the deflection mirror can be deflected virtually uniformly onto the object field to be illuminated, without this giving rise to light losses that become apparent in the object field in an intensity fluctuation over the field (uniformity) or in an intensity fluctuation over the pupil (apodization). Such intensity fluctuations over the pupil are compensated for in conventional systems by light from the light source with lower intensity being directed by first facet elements onto regions of the deflection mirror with high reflectivity and light from the light source with higher intensity being directed by other facet elements onto regions of the deflection mirror with low reflectivity. This procedure has a number of disadvantages. Firstly, two large undesired effects are compensated for relative to one another. This has the consequence of an increased sensitivity of all elements involved to imperfections in production. A small fluctuation in the production of the deflection mirror can therefore lead to a large fluctuation of the intensity over the pupil, which fluctuation cannot be afforded tolerance. Secondly, manufacturers of light sources in the EUV range are working on sources that provide light of constant intensity on all the facet elements. As soon as such sources are available, therefore, the abovementioned compensation will no longer be possible.

In the context of this application, a deflection mirror is understood to be a mirror whose maximum local curvature at a location of the mirror surface in any desired sectional plane is less than 0.2 m$^{-1}$. Such deflection mirrors in general primarily deflect the light and hardly contribute to the optical imaging of the illumination optical unit. A plane mirror, in particular, has no local curvature and is therefore not an imaging optical element either.

Furthermore, the object of the present invention is achieved by a deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, and wherein the layer system is designed such that, for light having a wavelength of less than 30 nm, for angles of incidence of greater than 55°, a reflectivity of at least 30% is achieved.

By virtue of the fact that the deflection mirror according to the invention has a high reflectivity for angles of incidence of greater than 55°, what can be achieved by comparison with previous deflection mirrors based purely on individual metal layers is that the light distribution incident on the deflection mirror is deflected virtually uniformly onto the object field to be illuminated, without this giving rise to light losses which become apparent in the uniformity over the field or in pupil apodization.

Consequently, a deflection mirror according to the invention makes it possible to realize intensity variations of less than 1% relative to the maximum intensity in the object field and corresponding apodizations of less than 2% for the illumination optical unit.

In the present document, the term layer denotes a single layer of a material that is applied areally on a substrate or another layer. Such a layer can vary laterally in terms of its thickness. A layer system is understood to be a sequence of one or a plurality of layers lying one above another in which the layers that are directly adjacent one above another consist of different materials. The thicknesses of all layers corresponding to one another at two different locations on the deflection mirror differ only by the same factor. Therefore, in the extreme case, a layer system can also consist of only one layer. Layer systems are known which consist of two or more layers in a periodic or else non-periodic sequence. Layer systems having more than one layer are designated as a multilayer. Layer systems can be described by the order of the materials from the substrate to the surrounding medium and the relative thicknesses thereof in relation to a reference thickness. Such a reference thickness can be, for example, the total thickness in a layer design. The local layer thickness is understood to be the sum of the thicknesses of all layers at the same location. A layer system also includes its lateral extent on the substrate. A layer system can cover the surface of the substrate wholly or else only partly.

Deflection mirrors comprising such layer systems have a reflectivity of greater than 30% in the case of an angle-of-incidence interval of between 0° and 20°. In this case, the reflectivity of the light is dependent on the polarization thereof. The light is decomposed into two orthogonal polarization components. The plane incidence is spanned by the normal to the surface of the deflection mirror at the impingement location of an incident light ray and the incident light ray itself. One of the two polarization components is perpendicular to the plane of incidence (s-polarized) and the other lies in the plane of incidence (p-polarized). The unpolarized reflectivity results as the average value of the reflectivity values of the two orthogonal polarization components. Since microlithography exposure apparatuses in the EUV wavelength range are often operated with unpolarized light, the unpolarized reflectivity curve (u-polarized) is taken as a basis in the present document.

A limit for the usability of such multilayers is usually given by the Brewster angle. By definition, no light whose polarization factor lies in the plane of incidence (p-polarized) is reflected at said angle. Accordingly, this component is also absent in the case of unpolarized incidence after reflection. The Brewster angle is determined by the refractive index of the layer materials and is very close to 45° for light in the wavelength range of between 5 nm and 30 nm, since the refractive indices of the known materials are very close to 1 at said wavelength.

The angle of incidence of a light ray is in this case defined as the angle between the direction of incidence of a light ray and the normal to the surface of the deflection mirror at the impingement location of the light ray on the deflection mirror. The angle of incidence is also designated by AOI. At every location of a deflection mirror, light rays can impinge from different directions. The average local angle of incidence of the deflection mirror is the average value of the angles of incidence of all rays which impinge at the same location on the deflection mirror. Therefore, the average local angle of incidence of the deflection mirror is dependent on the form of the deflection mirror itself and the position thereof in an optical system. The local angle-of-incidence interval results as the difference between the largest angle of incidence and the smallest angle of incidence. The global angle-of-incidence interval consequently results from the angular interval between the largest angle of incidence which occurs on the entire used region of the deflection mirror and the smallest angle of incidence which occurs somewhere on the entire used region of the deflection mirror.

In projection exposure apparatuses, however, it is also necessary to use deflection mirrors with angles of incidence of greater than 55°. Particularly for angles of incidence of greater than 65°, deflection mirrors with grazing incidence are known. The coating of said deflection mirrors typically consists of an individual metallic layer composed e.g. of gold, ruthenium, rhodium or palladium. The reflectivity of said deflection mirrors depending on the angle of incidence rises from approximately 30% at 65° to 100% at 90°. Deflection mirrors operated with grazing incidence have global angle-of-incidence intervals of 10° or more. From the global angle-of-incidence interval, using the reflectivity curve, that is to say the dependence of the reflectivity on the angle of incidence, this results in an intensity variation of the used light of 10% or more. Such an intensity variation leads to an impairment of the illumination quality of the illumination system and then consequently to an impairment of the imaging performance of the projection lens. For angles of incidence of less than 55°, the reflectivity for unpolarized light falls to 30% or lower. Reflectivities are specified as a ratio of reflected intensity to incident intensity. Consequently, reflectivity values vary in the range of between 0 and 1. Alternatively, reflectivities can be specified as percentages. In this case, a reflectivity of 1 corresponds precisely to 100%.

In one embodiment, at least one layer system is applied on a substrate, the local layer thickness of which at least one layer system varies continuously with the position on the mirror substrate. As a result, the connection locations of the zones known from the prior art do not occur. Furthermore, the invention has the advantage that such a coating is simpler to produce. If only one layer system is present, the coating can be applied in a single coating pass on the substrate. The local thickness factor is produced by adaptations in the coating apparatus. The thickness of the layer system is in this case varied such that the maximum local layer thickness at any location of the mirror surface is at least 1% greater than the minimum local layer thickness. It can also be 10% or higher. In this way, for angles of incidence of more than 55°, at wavelengths of less than 30 nm, high reflectivities, i.e. 30% or more, are obtained.

The thickness factor is the common factor by which all thicknesses of the single layers of a given layer system at a location on the substrate are multiplied in order to obtain a deviating thickness. The thickness factor refers to a layer system having a reference thickness. This reference thickness can be e.g. the thickness of the nominal layer design or the thickness at a specific location of the deflection mirror. A thickness factor of 1 thus corresponds exactly to this reference thickness.

The thickness factor as a further degree of freedom makes it possible for different locations of the deflection mirror to be adapted in a controlled manner to different local angle-of-incidence intervals occurring there, without having to change the layer design of the deflection mirror per se. The deflection mirror according to the invention yields, for larger angle-of-incidence intervals at different locations on the deflection mirror, higher reflectivity values than inherently permitted by the associated layer design given a constant thickness factor of 1. By virtue of the adaptation of the thickness factor, it is possible to achieve not only high local average reflectivities at high angles of incidence, but also a further reduction of the variation of the reflectivity of the deflection mirror according to the invention over the angles of incidence.

It has been recognized that an increase in the thickness factor as the average angle of incidence increases, for angles of incidence greater than the Brewster angle, leads to a monotonic increase in the reflectivity for unpolarized radiation in a large angle-of-incidence range. In one embodiment, therefore, the thickness factor increases as the angle of incidence increases.

A monotonic increase is understood here to mean that for each pair of locations on the deflection mirror having a first angle of incidence and a second angle of incidence, wherein the second angle of incidence is greater than the first angle of incidence, the associated reflectivities increase or at least remain constant. Therefore, the second reflectivity, associated with the second angle of incidence, is greater than or equal to the first reflectivity, associated with the first angle of incidence.

In one embodiment of the present invention, the substrate is covered with a layer system. In this case, the thickness factor of the layer is chosen such that, for increasing average angles of incidence on the deflection mirror, the reflectivity for light having the wavelength under consideration which impinges on the deflection mirror at this angle of incidence likewise increases or remains at the same level. By virtue of this choice of thickness factor, the reflectivity becomes maximal over the entire deflection mirror. In particular, a reflectivity of 50% or more can be achieved for all average angles of incidence of greater than 70°. It is also possible to extend the usable angular range to all angles of greater than 65° or even greater than 60°.

In one embodiment, the layer system consists of materials which are selected or combined as a compound from the group of materials: ruthenium, molybdenum and silicon. However, other coating materials can also be used.

It has furthermore been recognized that, in order to obtain a reflectivity of 50% for angles of incidence of greater than 55°, it is even possible to use multilayers having fewer periods than are known from the angle-of-incidence range below the Brewster angle. Thus, multilayers having 10 to 15 periods already obtain a reflectivity of greater than 50% at angles of incidence of greater than 55°. It is found that, in the angle-of-incidence range of between 60° and 70°, all layer systems having more than 10 periods already lead to similar reflectivities, in particular to reflectivities of more than 60%. From the use of periodic layers at angles of incidence of less than 45°, that is to say of angles of incidence which are less than the Brewster angle of the layer materials, period numbers N of 30 or more are known. In the range of large average angles of incidence, i.e. in the case of angles of incidence of greater than 55°, the variation of the thickness factor according to the invention not only leads to a monotonic reflectivity curve, but the multilayers also have lower numbers of periods and are therefore also easier to produce.

In a further embodiment, the at least one layer system has at least one barrier layer between the high refractive index and low refractive index materials. The barrier layer consists of a material selected or combined as a compound from the group of materials: $B_4C$, C, graphene, Si nitride, Si carbide, Si boride, Mo nitride, Mo carbide, Mo boride, Ru nitride, Ru carbide and Ru boride. These materials mentioned prevent the interdiffusion of the layers of the layer system.

The terms high refractive index and low refractive index in this case in the EUV wavelength range are relative terms with regard to the respective partner layer in a period of a layer system. Layer systems function in the EUV wavelength range in general only if a layer having an optically high refractive index effect is combined with an relative thereto optically lower refractive index layer as main constituent of a period of the layer system.

Barrier layers which comprise the material $B_4C$ and have a thickness of between 0.35 nm and 0.8 nm, preferably between 0.4 nm and 0.6 nm, lead in practice to high reflectivity values of the layer system. Particularly in the case of layer systems composed of ruthenium and silicon, barrier layers composed of $B_4C$ exhibit a maximum of reflectivity in the case of values of between 0.4 nm and 0.6 nm for the thickness of the barrier layer.

In a further embodiment, a deflection mirror according to the invention comprises a capping layer system having at least one layer composed of a chemically inert material which terminates the layer arrangement of the deflection mirror. The capping layer system is that layer which is furthest away from the substrate. The deflection mirror is thereby protected against ambient influences. In practice, a material from the group ruthenium or Si carbide has proved to be worthwhile.

In a further embodiment, the deflection mirror comprises a second layer system laterally alongside a first layer system. The reflectivity curve can thereby be adapted even better to the requirements of the projection exposure apparatus for microlithography.

Said second layer system can consist of a single layer of a suitably reflective material. Ruthenium, gold, rhodium or palladium are examples of such materials. However, other materials can likewise be used. The second layer system can also be a multilayer having a non-periodic sequence of relative thicknesses of the single layers. In this embodiment, a boundary line arises between the two layer systems. Conceptually, said boundary line is formed as a clearly defined step of the materials on the substrate. Owing to production, an unsharp smearing of the step can occur. The two layer systems are accordingly arranged laterally adjacent.

Another embodiment comprising at least two layer systems arranged alongside one another has one common layer or fewer than five common layers of the layer systems. Since the region of the multilayer as a first layer system and the region of the single layer as a second layer system, as topmost layer, can comprise a common material, e.g. ruthenium, it is advantageous to implement this layer in a simultaneous coating. In this embodiment, the thickness factor of the layer that is furthest away from the substrate first varies in a range of thickness factors of between 0.8 and 2 and then increases to a thickness factor of 10 or greater. In a spatially delimited region, a multilayer is present. The periodic layers of the multilayer end at or in the vicinity of the boundary line, at which the thickness factor of the topmost layer increases greatly.

In another embodiment, the second layer system comprises all apart from one layer of the first layer system. The number of layers of the first layer system is denoted by n. Accordingly, the second layer system comprises at least n−1 layers of the first layer system. As a result, a simultaneous coating can be achieved for the common layers of the two layer systems.

In a further embodiment, the boundary line is embodied as a line at a specific average angle of incidence. In this document, said specific angle of incidence is designated as limiting angle. Accordingly, light rays which impinge on the deflection mirror at average angles of incidence less than said limiting angle are reflected by a multilayer, and rays which impinge on the deflection mirror at greater average angles of incidence are reflected by the monolayer. The form of said boundary line on the deflection mirror substrate is dependent on the design of the optical system and on the arrangement of the deflection mirror in the optical system. Such deflection mirrors have a straight boundary line. However, curved forms are also possible. In this case, the limiting angle is greater than 65°, preferably greater than 70°, particularly preferably greater than 75°.

Another embodiment makes use of the fact that illumination systems of microlithography apparatuses in the EUV wavelength range have a collector. Said collector has the task of collecting light from the source from a largest possible solid angle range and coupling it into the optical illumination system. Since said collectors require mechanical mounts and struts, shaded areas arise on the downstream mirrors of the illumination system. In this document, shaded areas are understood to mean regions on optical elements in which the intensity of the used light locally decreases to less than 10% of the maximal intensity of the used light on the relevant optical element. In this case, the used light is the wavelength range which contributes to an imaging of the structure on the mask onto the wafer. By way of example, given a central wavelength of 13.5 nm, the range of the used light of from approximately 13.3 to 13.7 nm should be taken into consideration. Wavelengths which deviate from the central wavelength by a factor of 2 or more do not contribute to the imaging.

Therefore, it is expedient to choose the boundary line such that it falls within a region that is shaded from the used light. Manufacturing faults in the region of the boundary line have no effect on the imaging of the structure of the mask onto the wafer. The boundary line determined by shading can coincide with the boundary line defined by a limiting angle. Whether this is the case or not is again dependent on the optical design of the system.

For all coating materials, the reflectivity at an angle of incidence of 90° has to be 1, i.e. 100%, if absorption is disregarded. On the other hand, for a good imaging quality it is advantageous to have a small variation of the reflectivities on the mirror surface. Multilayers have a reflectivity of greater than 50%, preferably 65%, particularly preferably of 70%, in the angle-of-incidence range greater than 55°. If a second layer system having a single layer is adjacent at higher angles of incidence, then this results in an increase, proceeding from the reflectivity of the multilayer at the highest angle of incidence thereof, to 100% at an angle of incidence of 90°.

In a further embodiment, therefore, the reflectivity of the second layer system is attenuated at high angles of incidence in such a way that the reflectivity curve exhibits only a small variation of the reflectivity in a large range of the angles of incidence. In this case, this range is as large as possible, preferably angles of incidence of between 60° and 75°, particularly preferably angles of incidence of between 55° and 80°. The variation of the reflectivity over the common angle-of-incidence range of both layer systems is then as small as possible, preferably less than 10%, particularly preferably less than 5%. Such an attenuation of the reflectivity at angles of incidence of greater than 75° can be effected by various techniques.

In one embodiment, an absorbent layer is applied to the second layer system. By way of example, materials selected from the group: Cr, TiN, TaN, TaBN, CrN, Mo, Au, Ir, Ni, Cu, Co, Pt are suitable for this purpose. However, any other material that is absorbent in the range of the wavelength of the used light is also suitable.

In another embodiment, the roughness of the second layer system is increased in a targeted manner, such that the reflectivity is reduced as a result.

Furthermore, the object of the present invention is achieved by an illumination optical unit for a microlithography projection exposure apparatus comprising at least one optical element having reflective facet elements and a deflection mirror as claimed in any of the preceding claims, wherein the deflection mirror deflects the light prepared by the facet elements with grazing incidence onto an object field in an object plane of the projection exposure apparatus, thus resulting in homogeneous illumination of the object field.

The use of a deflection mirror according to the invention in an EUV illumination optical unit makes it possible to ensure a homogeneous illumination of the object field with an intensity variation over the object field of less than 1% of the maximum intensity in the object field. This is not possible with previous deflection mirrors based purely on metallic single layers. This problem will also be aggravated still further in future systems, since, with a higher numerical aperture of said systems, the angle-of-incidence spectrum in the case of the deflection mirror of an illumination optical unit will inevitably shift in the direction of lower angles of incidence.

In one embodiment, the deflection mirror of the illumination optical unit is a plane mirror and is situated as the last mirror of the illumination optical unit directly upstream of the object plane of the projection exposure apparatus. Such plane mirrors as deflection mirrors are relatively simple to produce and can be mounted and aligned relatively simply in the illumination optical unit.

Furthermore, the object of the present invention is achieved by a projection exposure apparatus comprising a deflection mirror according to the invention or an illumination optical unit according to the invention.

Further features and advantages of the invention will become apparent from the following description of exemplary embodiments of the invention with reference to the figures, which show details essential to the invention, and from the claims. The individual features can each be realized individually by themselves or as a plurality in any desired combination in a variant of the invention.

BRIEF DESCRIPTION OF THE DRAWINGS

Exemplary embodiments of the invention are explained in greater detail below with reference to the figures, in which.

DETAILED DESCRIPTION OF EXEMPLARY EMBODIMENTS

Figure 1:
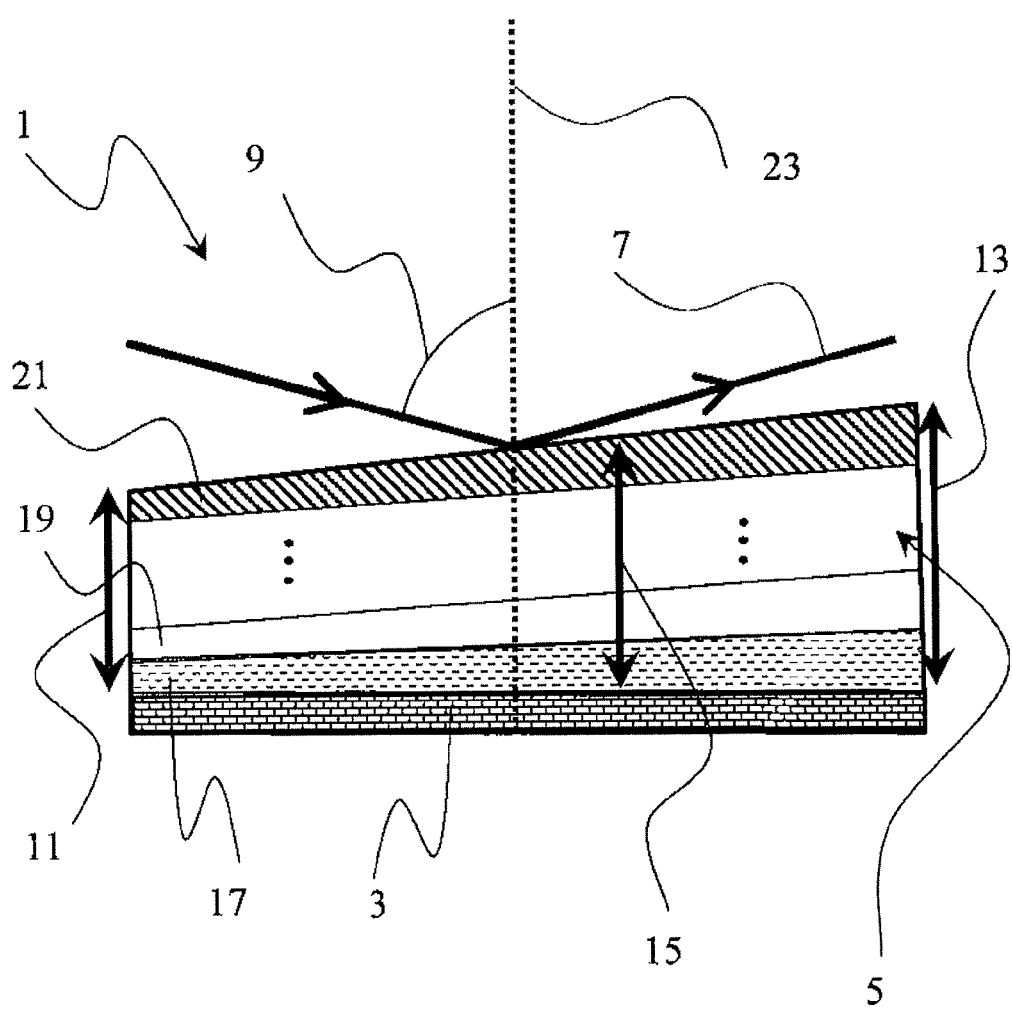
FIG. 1 shows a deflection mirror with coating with thickness profile in the multilayer with grazing incidence.

FIG. 1 shows in schematic illustration the cross section through a deflection mirror 1 for a projection exposure apparatus for microlithography. Said mirror comprises a substrate 3 and at least one layer system 5. The layer system is designed such that a reflectivity of at least 30% is achieved for light 7 having a wavelength of less than 30 nm which impinges at an average angle of incidence 9 of greater than 55°. The layer system 5 consists of a sequence of high refractive index and low refractive index layers 17, 19. Layer systems are known in which, from the substrate, firstly the low refractive index material and then the high refractive index material follow, and also for the opposite sequence. The average local angle of incidence 9 is related to the surface normal 23. The thickness profile of the layer system 5 is illustrated in a greatly exaggerated fashion in the figure. It therefore appears as though the surface normal 23 is perpendicular only to the substrate 3 but not to the surface of the layer system. However, since the total thickness of the layer system for EUV light is less than the diameter of the deflection mirror by a few orders of magnitude, the layer system in the region relevant to the light ray 7 is practically parallel to the substrate 3. The layer system 5 has a laterally varying local thickness 15. In this case, the minimum local thickness 11 of the layer system deviates from the maximum local thickness 13 of the layer system by at least 1% of the minimum local thickness 11. Deviations by at least 10% of the minimum local thickness 11 are particularly advantageous.

One layer system 5 with which this result can be achieved is as follows.

TABLE 1

| refractive indices used $\tilde{n} = n - i * k$ for 13.5 nm | | | |
|---|---|---|---|
| Material | Chemical symbol | n | k |
| Silicon | Si | 0.999362 | 0.00171609 |
| Boron carbide | B4C | 0.963773 | 0.0051462 |
| Molybdenum | Mo | 0.921252 | 0.0064143 |
| Ruthenium | Ru | 0.889034 | 0.0171107 |
| Vacuum | | 1 | 0 |

The following short notation is declared:
Substrate/ . . . /(HBLB)*N/capping layer system C In this case, the letter H stands symbolically for the thickness of high refractive index layers, the letter L for the thickness of low refractive index layers, the letter B for the thickness of the barrier layer, and the letter C for the thickness of the chemically inert terminating layer. N is the number of periods.

In this case, the unit [nm] applies to the thicknesses of the single layers indicated between the parentheses. No barrier layers were used in the multilayer used here. The layer design used can thus be specified in the short notation as follows:
Substrate/ . . . /(8.55 Si 6.45 Mo)*15/1.5 Ru The reference signs are chosen such that objects illustrated in FIG. 1 have been provided with numbers having one digit or two digits. The objects illustrated in the further figures have reference signs having three or more digits, wherein the last two digits indicate the object and the preceding digit indicates the number of the figure in which the object is illustrated. The reference numerals of corresponding objects which are illustrated in a plurality of figures therefore correspond in terms of the last two digits. If appropriate, the description of these objects can be found in the text concerning a previous figure.

Figure 2:
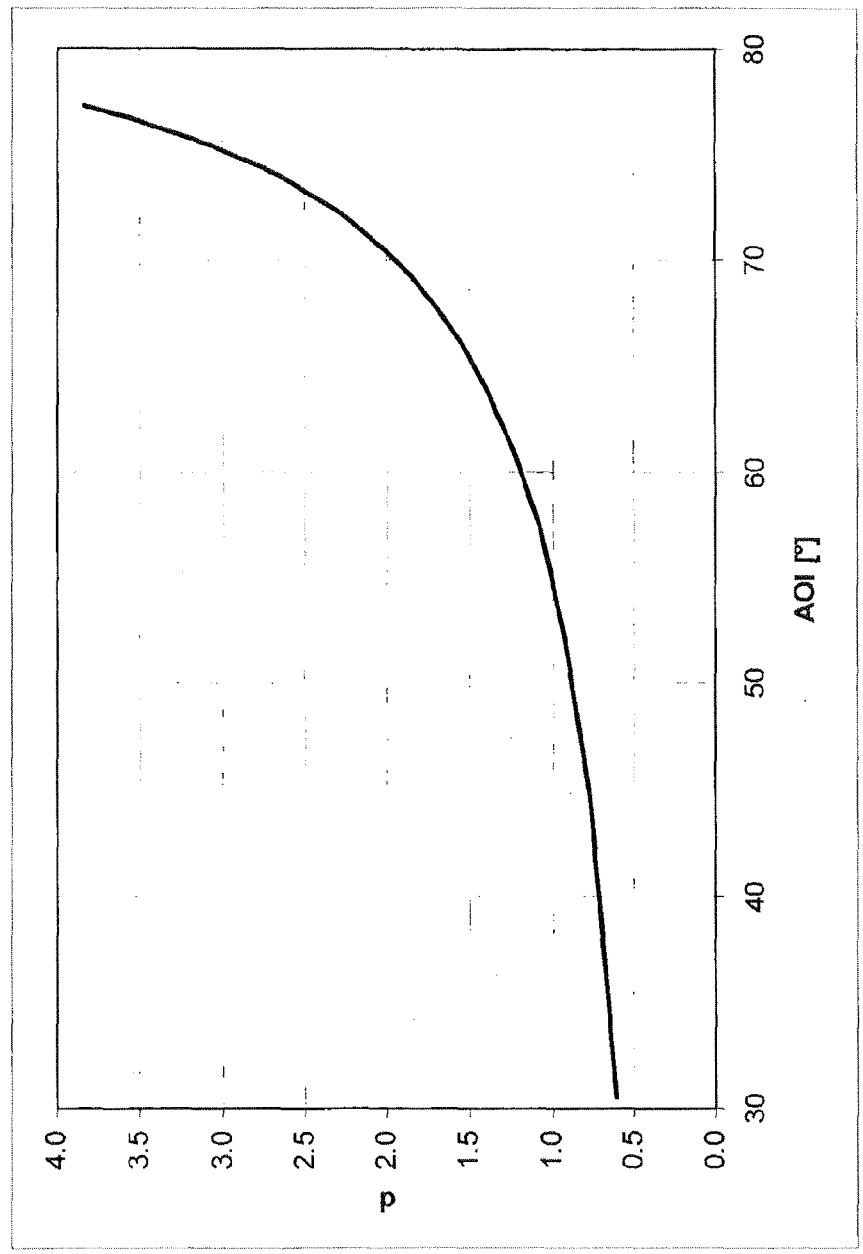
FIG. 2 shows the thickness profile as a function of the average angle of incidence.

FIG. 2 shows an example of the thickness factors used as a function of the average angle of incidence. The thickness factors are determined such that the maximum achievable reflectivity is obtained for the corresponding angle of incidence at a wavelength of 13.5 nm.

Figure 3:
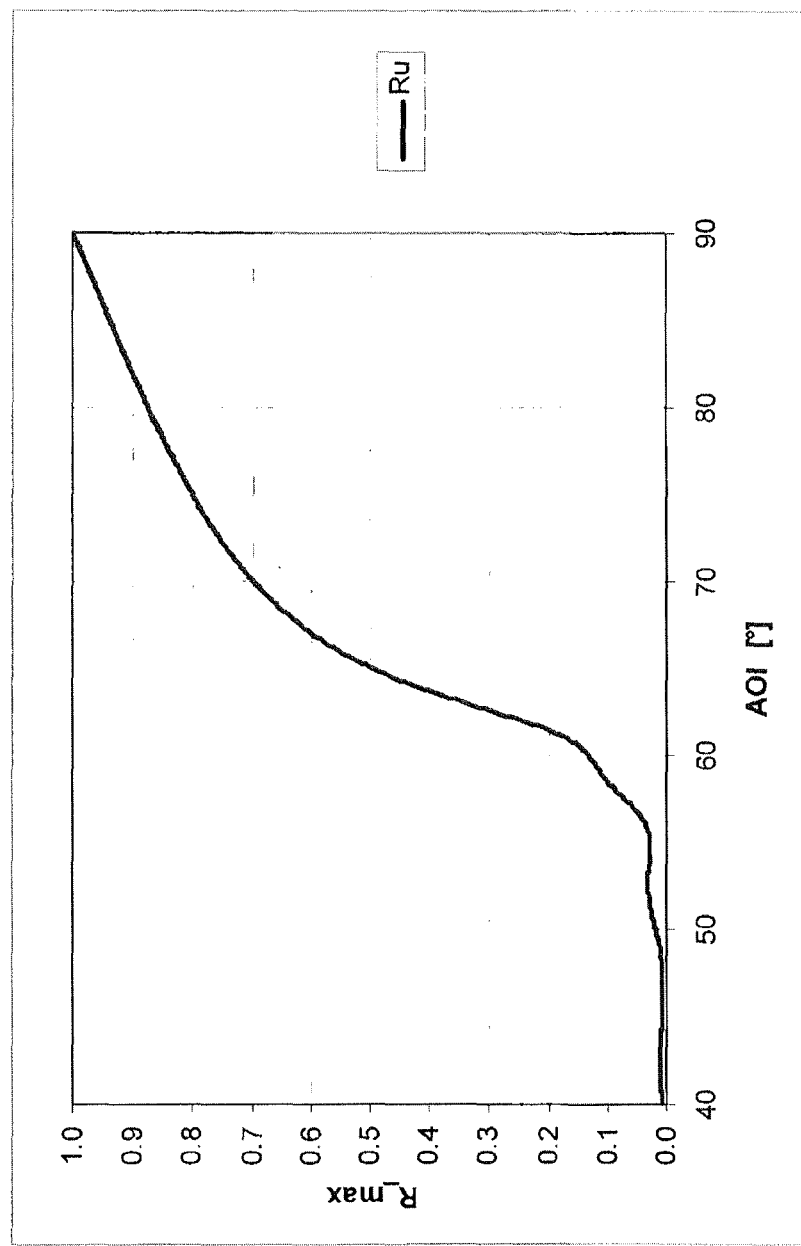
FIG. 3 shows the reflectivity curve of a single layer of ruthenium.

FIG. 3 shows the reflectivity curve for unpolarized radiation of a single layer of ruthenium. In a reflectivity curve, the reflectivity R_max is illustrated as a function of the angle of incidence AOI. The reflectivity in the figures is specified in the range of between 0 and 1. The high reflectivity at angles of incidence of greater than 70° is used on deflection mirrors with grazing incidence. Such deflection mirrors operated with grazing incidence are relatively insensitive to fluctuations in the thickness of the layer system. As soon as the thickness of the layer is large enough to ensure the reflectivity, a further increase in the thickness scarcely changes the reflectivity. Therefore, such layer systems can be manufactured in a simple manner.

All refractive indices are wavelength-dependent. Therefore, all the reflectivity curves shown are valid only for a specific wavelength. 13.5 nm was chosen in the embodiments shown here. However, corresponding results can also be achieved for other wavelengths.

Figure 4:
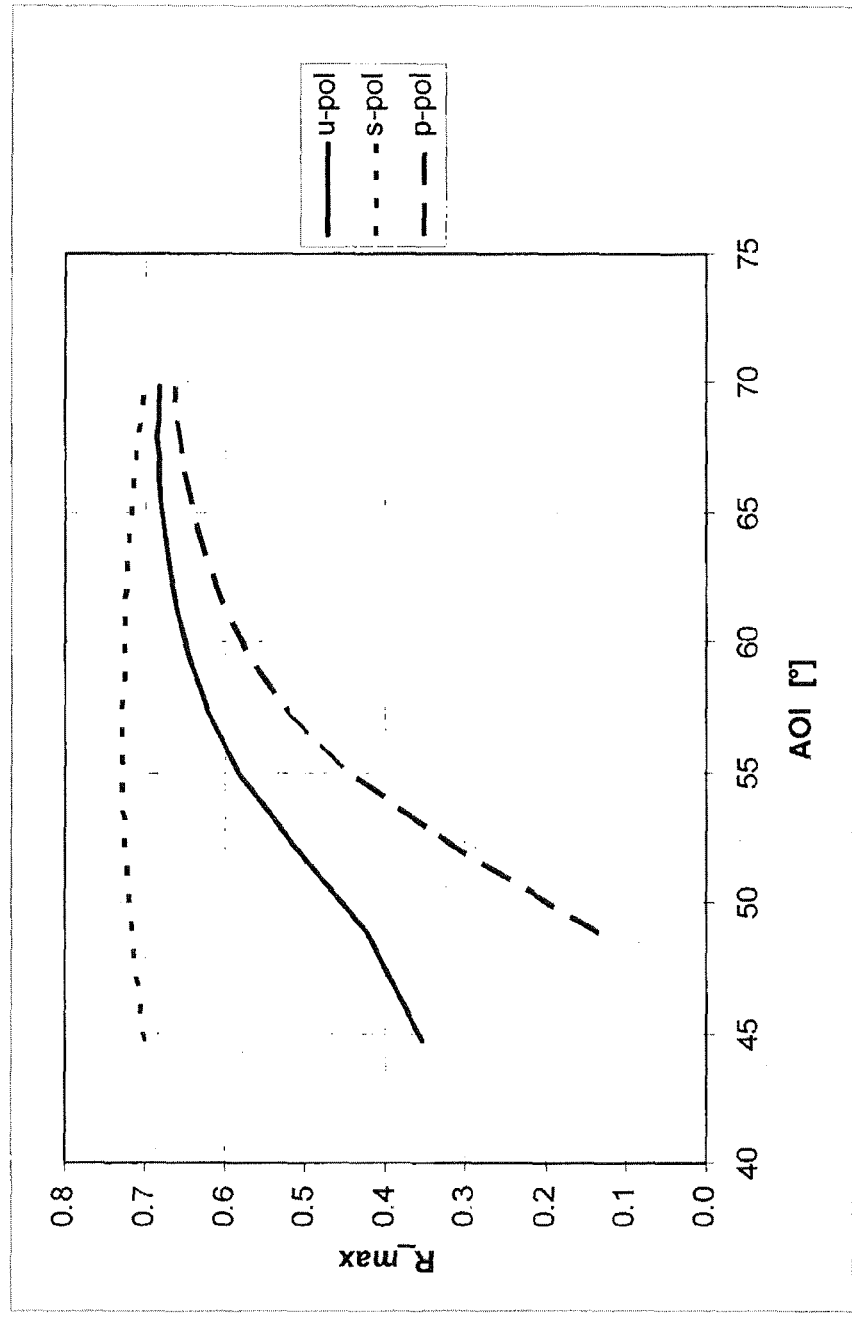
FIG. 4 shows the reflectivity curve of a multilayer, and the reflectivity curves of the two polarization components.

FIG. 4 shows three reflectivity curves for different polarization states of the incident light for a multilayer. The maximum achievable reflectivity is plotted as a function of the angle of incidence. The maximum achievable reflectivity results as the maximum value of the reflectivity of the multilayer given a fixed thickness factor. If the thickness factor is increased, the position of the maximum achievable reflectivity shifts to higher angles of incidence. Thus, the maximum achievable reflectivity in each case can be obtained by adapting the thickness factor on the deflection mirror for the angle of incidence present at this location. The best thickness factor with respect to the plotted angle of incidence has in each case been chosen in FIG. 4. Each point on the reflectivity curves accordingly belongs to a different specifically adapted thickness factor. In the embodiment shown here, the thickness of the layer system varies from 13 nm at an average angle of incidence of 55° up to a thickness of 26 nm at an average angle of incidence of 70°. The variation of the thickness factor is a factor of 2 in this example. In the case of an increasing angle of incidence, the reflectivity for unpolarized light also increases or remains at a level once the latter has been reached. The reflectivity curve therefore rises monotonically. If only a smaller angle-of-incidence range is required on the deflection mirror, then a smaller variation of the thickness factors also suffices to achieve the desired monotone behavior of the reflectivity. The same behavior results for p-polarized light. In this example, the thickness factors are adapted for unpolarized light.

Figure 5:
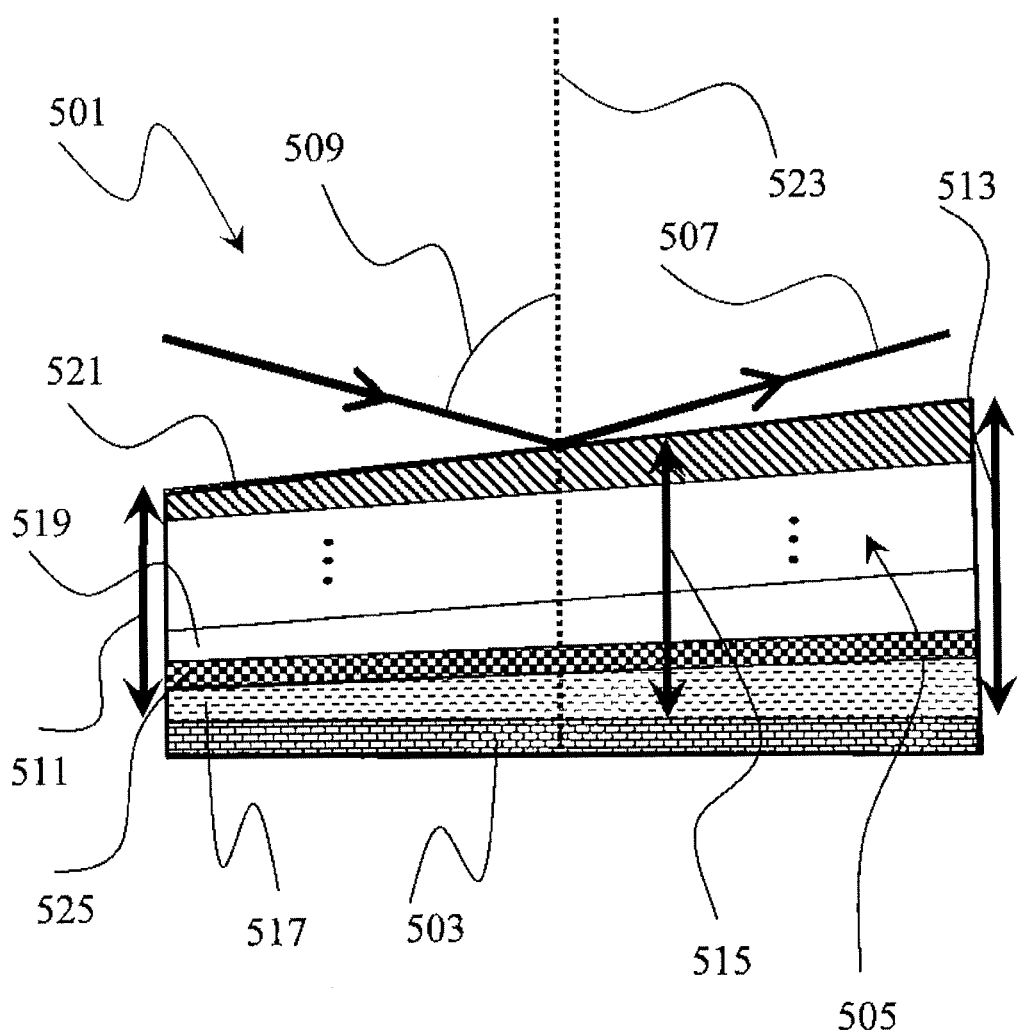
FIG. 5 shows a deflection mirror with coating with thickness profile in the multilayer with grazing incidence with barrier layer and capping layer.

FIG. 5 schematically shows the cross section through a deflection mirror 501 for a projection exposure apparatus for microlithography. Said mirror comprises a substrate 503 and at least one layer system 505. The layer system is designed such that a reflectivity of at least 30% is achieved for light 507 having a wavelength of less than 30 nm which impinges at an average angle of incidence 509 of greater than 55°. A barrier layer 525 is respectively inserted between the high refractive index and low refractive index layers 517, 519. Such barrier layers impede the formation of chemical compounds of the individual materials and also the interdiffusion of the materials in one another. The barrier layer 525 consists of materials which are selected or combined as a compound from the group of materials: molybdenum, silicon, B4C, C, Si nitride, Si carbide, Si boride, Mo nitride, Mo carbide, Mo boride, Ru nitride, Ru carbide and Ru boride. The layer system has a laterally varying local thickness 515. In this case, the minimum local thickness 511 of the layer system deviates from the maximum local thickness 513 of the layer system by at least 1% of the minimum local thickness. The capping layer here consists of ruthenium. Si carbide could likewise be used.

Figure 6:
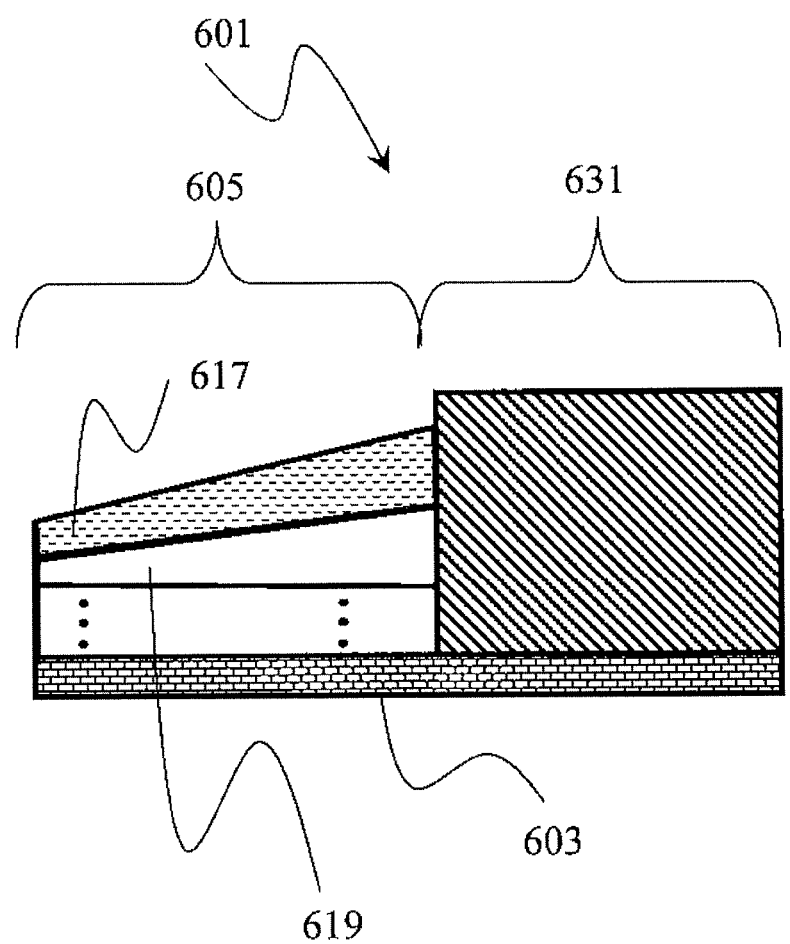
FIG. 6 shows a deflection mirror with coating with a first and a second layer system.

FIG. 6 schematically shows the cross section through a first layer system 605 and a second layer system 631. In this embodiment, two layer systems are applied on a substrate 601. The first layer system 605 is a periodically constructed multilayer. Only one period of the high refractive index and low refractive index layers 617 and 619 is shown. In this embodiment, the thickness factor of the multilayer is increased linearly from the left-hand edge of FIG. 6 to the center. This is illustrated by the wedge shape of the layer materials. A second layer system 631 consisting of a single layer is applied in the right-hand region. A second layer system having a constant thickness profile is shown; other variants such as e.g. a linear thickness profile are also expedient depending on the optical system.

Figure 7:
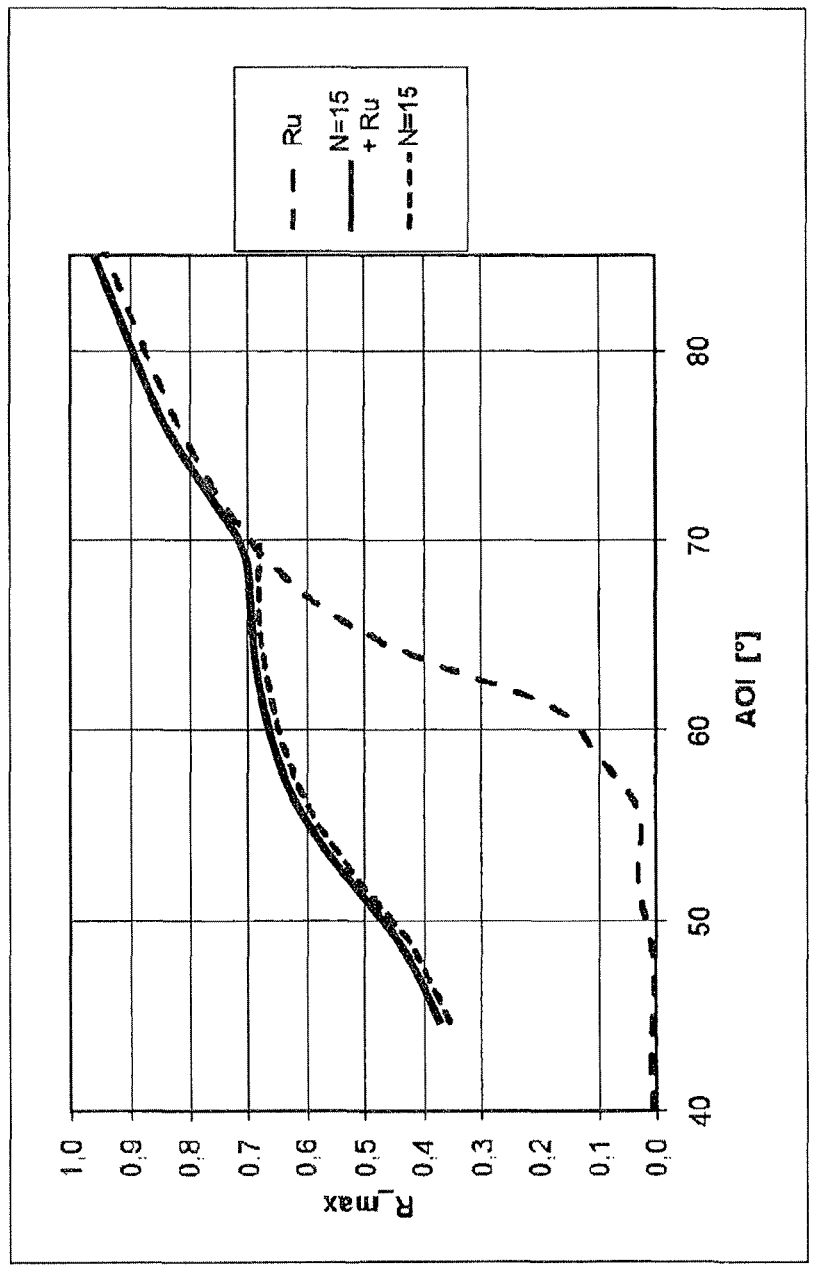
FIG. 7 shows the reflectivity curve of a deflection layer coated in one region with a multilayer, and in another region with ruthenium.

FIG. 7 shows the reflectivity curve of an embodiment of the invention with a first layer system realized as a multilayer and a second layer system realized as a single layer. The respective reflectivity curves of the single layer systems are shown by interrupted lines. The solid line represents the reflectivity profile of the entire deflection mirror. In a spatial region of the deflection mirror with angles of incidence of less than 70°, the multilayer 605 with an adapted thickness profile is applied; in the region with angles of incidence of greater than 70°, the single layer 631 is applied. The reflectivity curve shown relates to a multilayer composed of 15 periods comprising molybdenum and silicon as material of the layers. Barrier layers composed of B4C separate the single layers in this case. For protection against ambient influences, the multilayer is protected with a topmost layer composed of ruthenium. In this case, the topmost layer is the one which is at the greatest distance from the substrate. The deflection mirror has a monotonically increasing profile of the reflectivity curve over the entire angle-of-incidence range of from 45° to 85°. Since the reflectivity rises to 100% at 90°, the profile likewise rises monotonically in the range (not shown) between 85° and 90°. As a result, a more favorable used light distribution of the illumination system arises and a better imaging quality is achieved. In particular the plateau in the reflectivity for an average angle of incidence of between 55° and 70° is distinguished by a variation of less than 10% in the reflectivity independently of the angle of incidence. In this example, the reflectivity at an average angle of incidence of 55° is 58%, and at an average angle of incidence of 70° the reflectivity is 68%. This range is particularly advantageous for the imaging effect.

Figure 8:
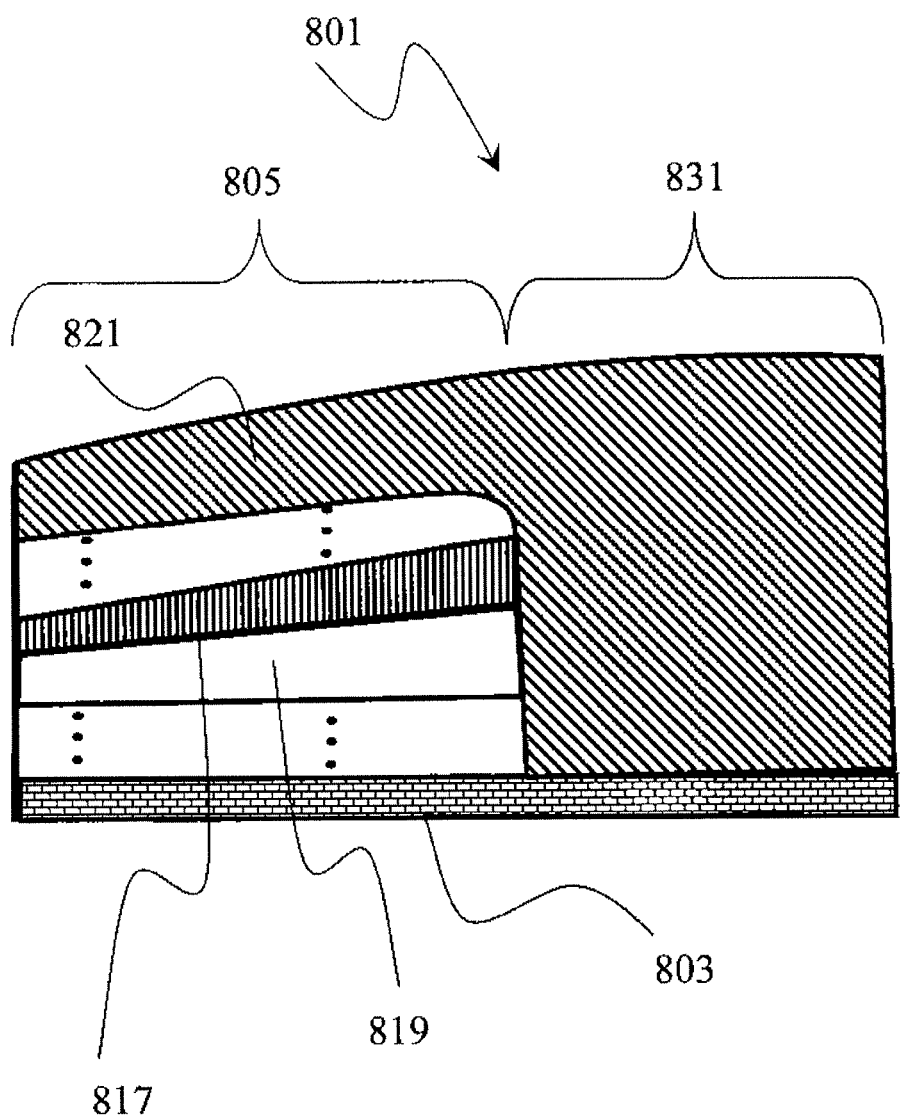
FIG. 8 shows a deflection mirror with coating with continuous ruthenium layer and multilayer in locally delimited region.

In a further exemplary embodiment, FIG. 8 shows the schematic cross section through a first layer system 805 and a second layer system 831. In this embodiment, both layer systems are applied on a mirror substrate 803. It has been recognized that ruthenium is used for achieving various aims. Firstly, it serves as a coating material of layer systems which consist only of a single layer, for grazing incidence, secondly, it serves as a capping layer of multilayers. In this embodiment, at least one layer is common to both layer systems 805 and 831. In FIG. 8, the layer 821 that is furthest away from the substrate is present on the entire region of the deflection mirror. Greatly nonlinear thickness factors of this layer can arise in this case. There are layers such as the periodic layers of a multilayer 817 and 819 which are present only on a spatially delimited region of the deflection mirror. Depending on the layer design it is possible for up to 5 layers to be present on the complete deflection layer.

Figure 9:
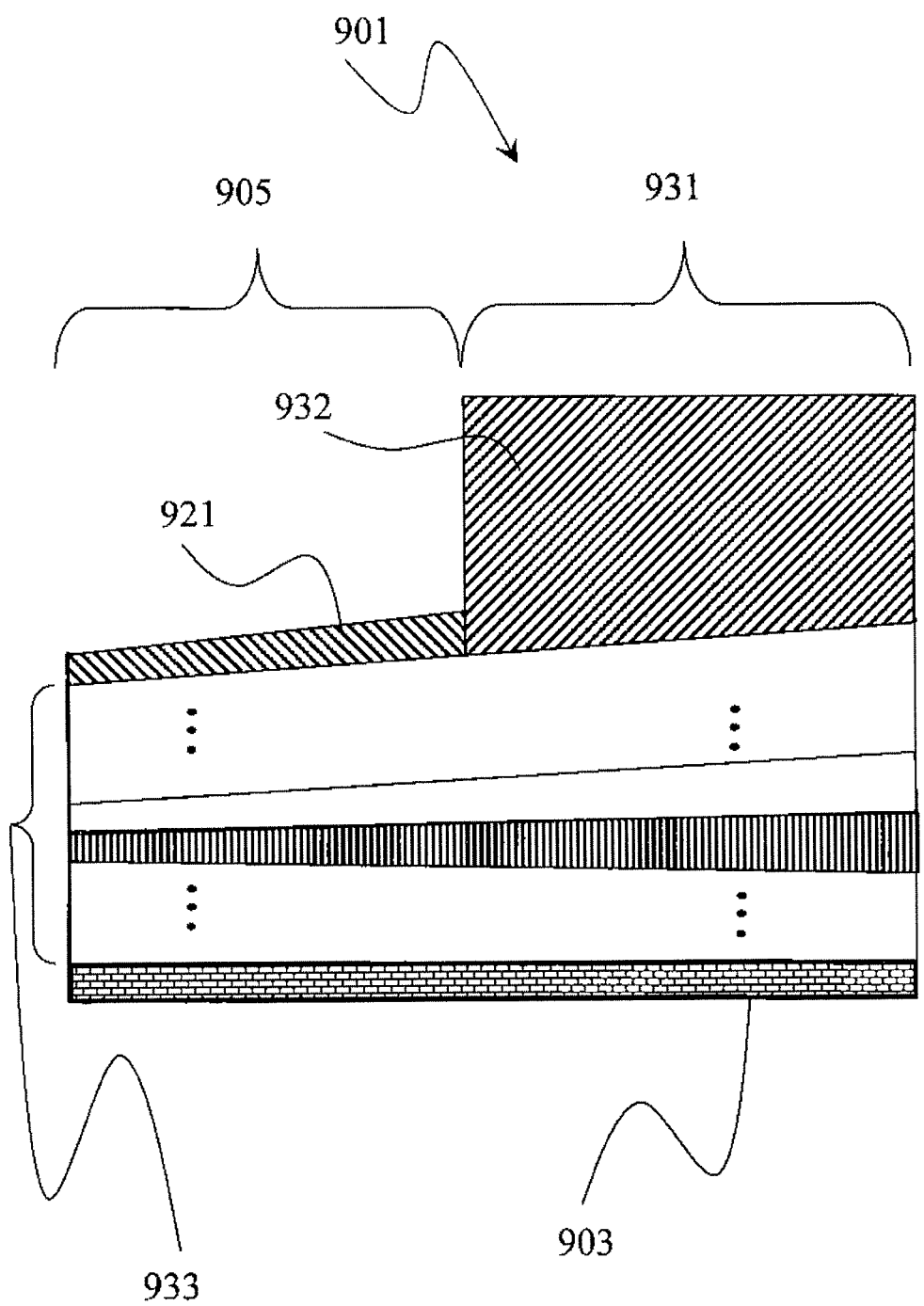
FIG. 9 shows a deflection mirror with a first and a second layer system, which is identical to the first apart from one layer.

FIG. 9 schematically shows the cross section through a deflection mirror 901 with at least a first layer system 905 and a second layer system 931. In this embodiment, the first layer system 905 is embodied as a multilayer with a capping layer 921. The number of layers of the first layer system in total is n. The second layer system 931 contains all but one layer of the first layer system. The second layer system thus contains the entire group 933 of the n−1 layers which are also present in the first layer system. In the embodiment illustrated, a further single layer 932 is added to the n−1 layers 933. The second layer system could also contain a non-periodic, second multilayer as a further layer. It would likewise be possible to embody the first layer system as a single layer.

Figure 10:
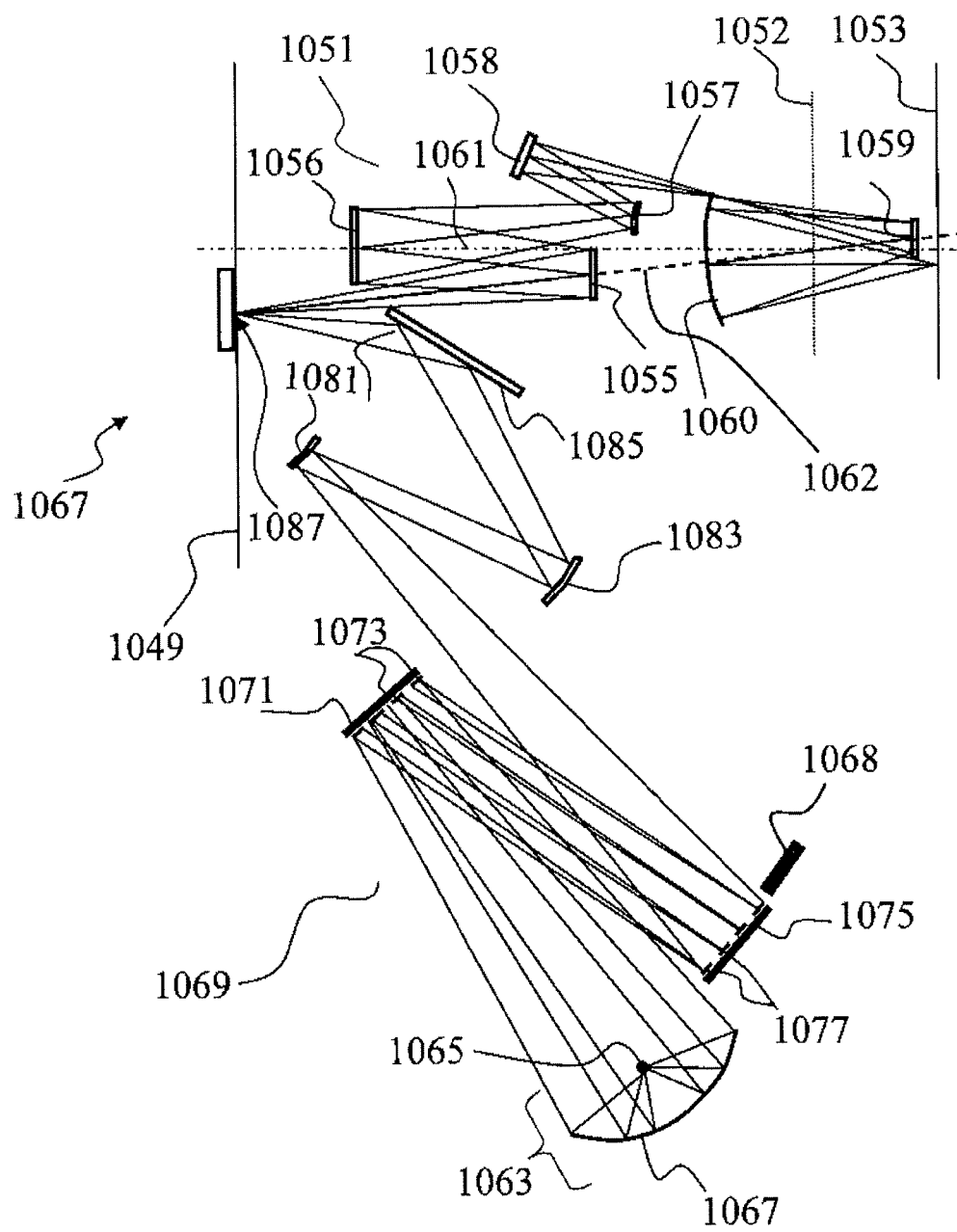
FIG. 10 shows an optical system for microlithography with deflection mirror according to the invention.

FIG. 10 schematically shows a configuration of a projection exposure apparatus 1067 comprising an illumination optical unit 1069. In this case, the illumination optical unit 1069 comprises a first optical element 1071 having a plurality of first reflective facet elements 1073 and a second optical element 1075 having a plurality of second reflective facet elements 1077. Arranged in the light path downstream of the second optical element 1077 are a first mirror 1081 and a second mirror 1083, which are both operated with normal incidence, that is to say that the radiation impinges on both mirrors at an angle of incidence of between 0° and 45°. A deflection mirror 1085 is arranged downstream which directs the radiation impinging on it onto the object field 1087 in the object plane 1049. The deflection mirror 1085 is operated with grazing incidence, that is to say that the radiation impinges on the deflection mirror at an angle of incidence of between 45° and 90°. The invention is used on this deflection mirror. A reflective structure-bearing mask is arranged at the location of the object field 1087, said mask being imaged into the image plane 1053 with the aid of the projection optical unit 1051. The projection optical unit 1051 comprises six mirrors 1055, 1056, 1057, 1058, 1059 and 1060. All six mirrors of the projection optical unit 1051 each have a reflective optical surface running along a surface that is rotationally symmetrical about the optical axis 1061.

Figure 11:
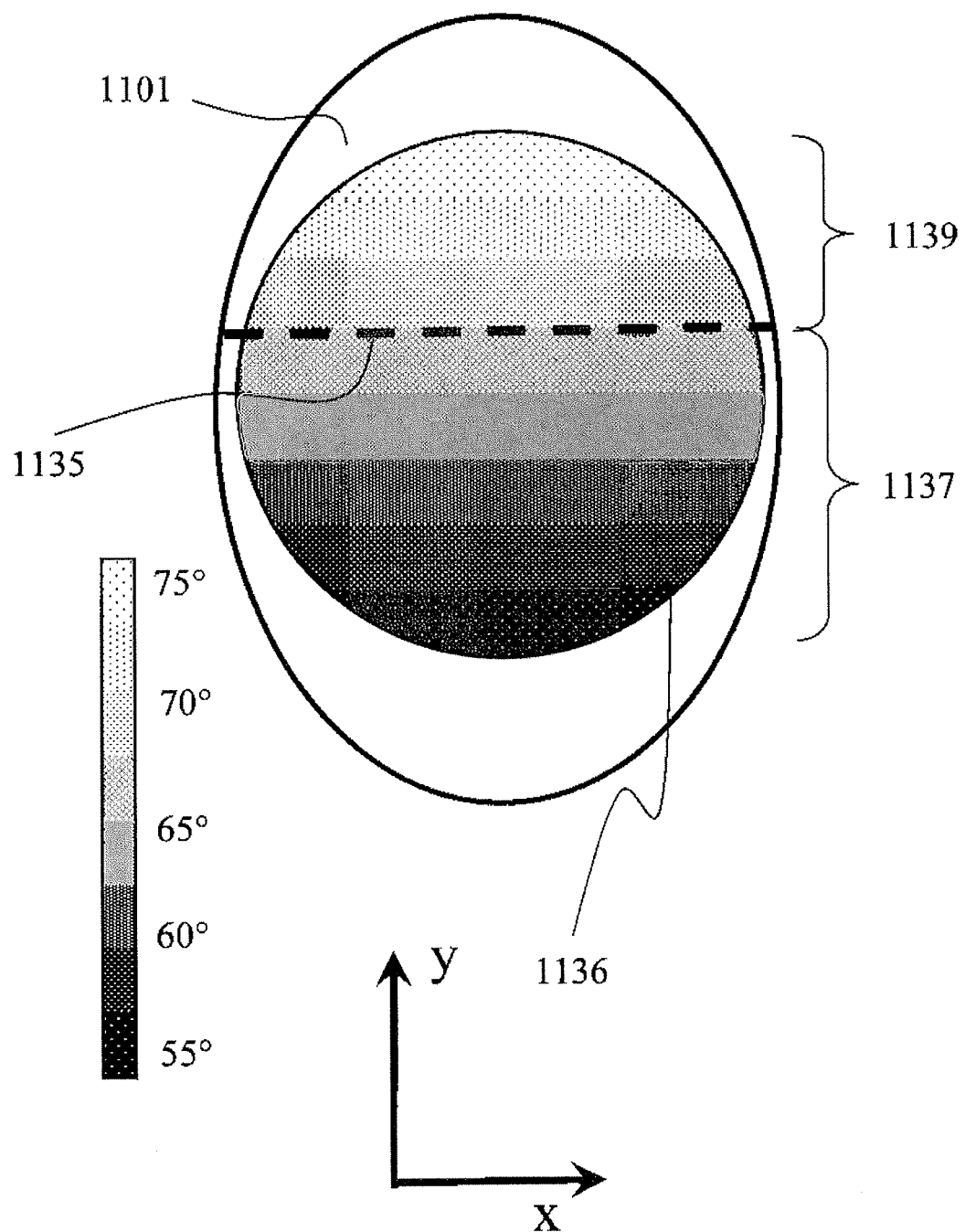
FIG. 11 shows the angle-of-incidence distribution on a deflection mirror with boundary line of the coating regions according to angles of incidence.

FIG. 11 schematically shows a mirror 1101. That region 1136 of the deflection mirror on which used light of the illumination system of a microlithography apparatus impinges is shown in hatched fashion. Possible mounts, correction elements or other articles which are necessary for the operation of the microlithography apparatus but are unimportant for the present invention are not shown. Different hatchings indicate which average angle of incidence occurs at which location of the deflection mirror. A local x-y coordinate system is depicted. In this example, it is found that a variation of the average angle of incidence over the mirror surface occurs in the y-direction of the imaging. In the x-direction, the average angle of incidence remains constant in each case. Other distributions of the average angles of incidence on the mirror surface are also possible. FIG. 11 depicts the boundary line 1135 separating the deflection mirror into two regions 1137 and 1139. In this case, the boundary line 1135 identifies the position of the limiting angle on the deflection mirror. Depending on the optical design, curved boundary lines can also occur. 70° was chosen here as the limiting angle. The region of the deflection mirror with smaller angles of incidence, that is to say the lower region 1137 in FIG. 11, is covered with a multilayer. In this case, said multilayer has a variation of the thickness factors. In this case, the thickness factors can be gathered from FIG. 2. The region 1139 on the deflection mirror which has larger angles of incidence than the limiting angle is coated with a single layer of ruthenium in this exemplary embodiment.

Figure 12:
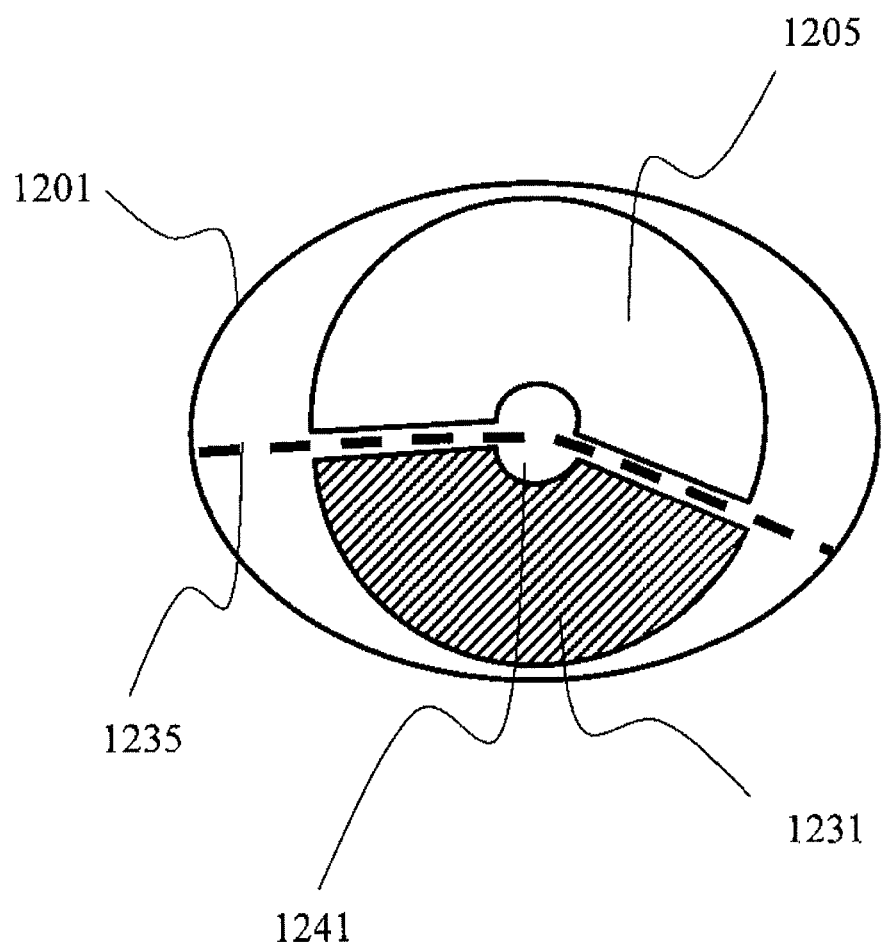
FIG. 12 shows coating regions on a deflection mirror separated according to illuminance.

FIG. 12 schematically shows a further deflection mirror. As in FIG. 11, the region 1201 of the deflection mirror on which used light could impinge in principle is shown here. Mechanical boundary conditions in the system can lead to shaded areas. Therefore, on a deflection mirror 1085, used light impinges only on the regions 1205 and 1231. The region 1241 in between is shaded. In this case, it is expedient not to define the regions of the coating by the angle of incidence, but rather to place the boundary line 1235 between the regions of the coating into the shaded region 1241. A multilayer is applied in the region 1205 and a single layer of ruthenium is applied in the region 1231. Likewise, of course, two different multilayers or the same multilayer with different profiles of the thickness factors could also be applied in the regions. Since the boundary line 1235 between the regions now lies in an unused part of the deflection mirror, the requirements made of the accuracy for the transition region of the coatings are relaxed. The coatings only have to satisfy the requirements of the microlithography exposure apparatus in the used regions 1205 and 1231. As well as the direct used light, real microlithography exposure apparatuses also have stray light for example as a result of scattering at rough surfaces or as a result of reflections at mounts. Therefore, it is possible for light in the used wavelength range of e.g. 13.3 nm-13.7 nm to be incident in the geometrically shaded region 1241. However, this light does not then contribute to the imaging of the mask onto the wafer. Therefore, up to 10% of the maximum intensity of the used wavelength which actually impinges on the mirror surface 1101 can pass into the unused region 1241. Furthermore, it is possible for light having a distinctly different wavelength, e.g. at 300 nm or at 1000 nm, to impinge there. This is unimportant for the present invention.

Figure 13:
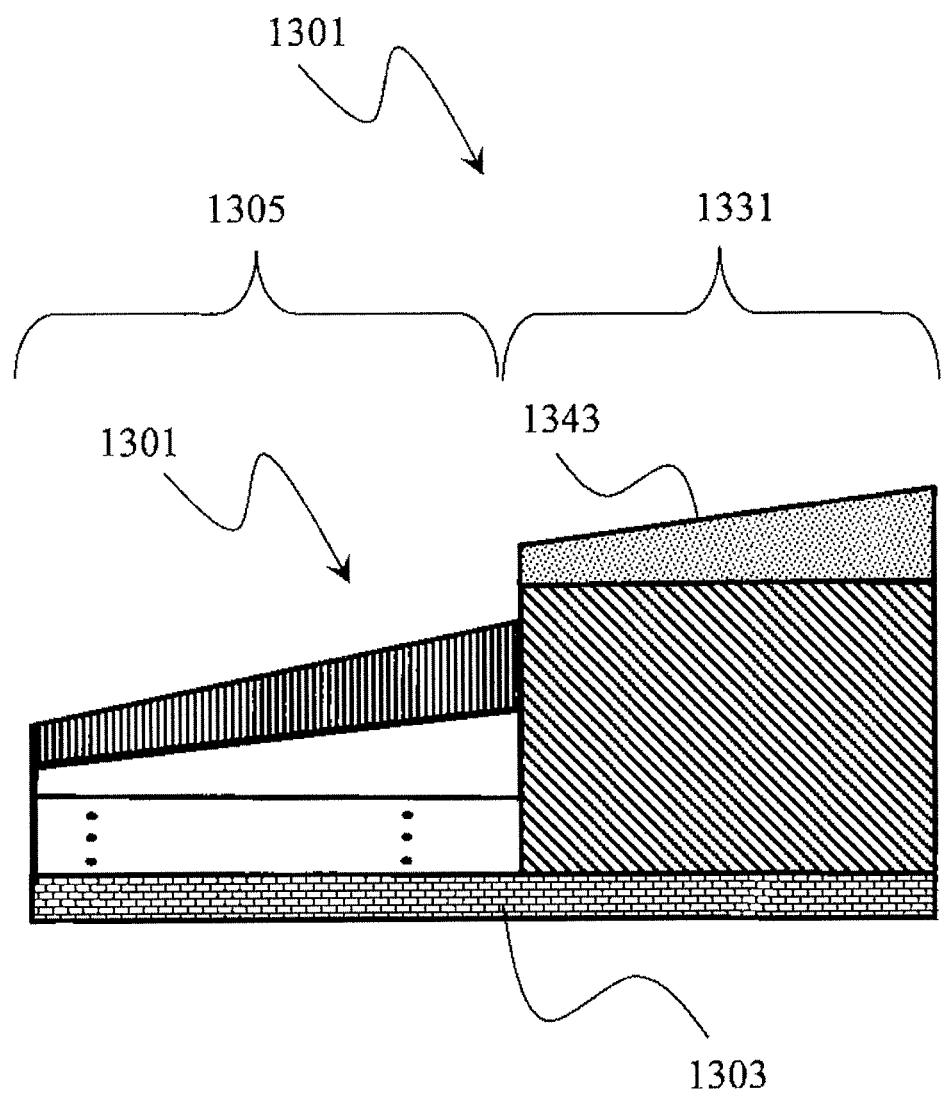
FIG. 13 shows a deflection mirror with coating with two layer systems and an absorber layer on the second layer system.

FIG. 13 schematically illustrates the cross section through a deflection mirror 1301 having at least a first layer system 1305 and a second layer system 1331. In this embodiment, the first layer system 1305 is embodied as a multilayer with a capping layer 1321. The second layer system 1331 contains a layer 1343 of the first layer system which is furthest away from the substrate 1303 and has an absorbent action. By applying a highly absorbent layer 1343 in the second layer system, it is possible to reduce the increase in the reflection curve for average angles of incidence of greater than 70°. The reflection curve therefore has a flatter profile and more uniform illumination of the mask is the consequence. In this case, the absorbent layer can be selected or combined as a compound from the group of materials: Cr, TiN, TaN, TaBN, CrN, Mo, Au, Ir, Ni, Cu, Co, and Pt.

Figure 14:
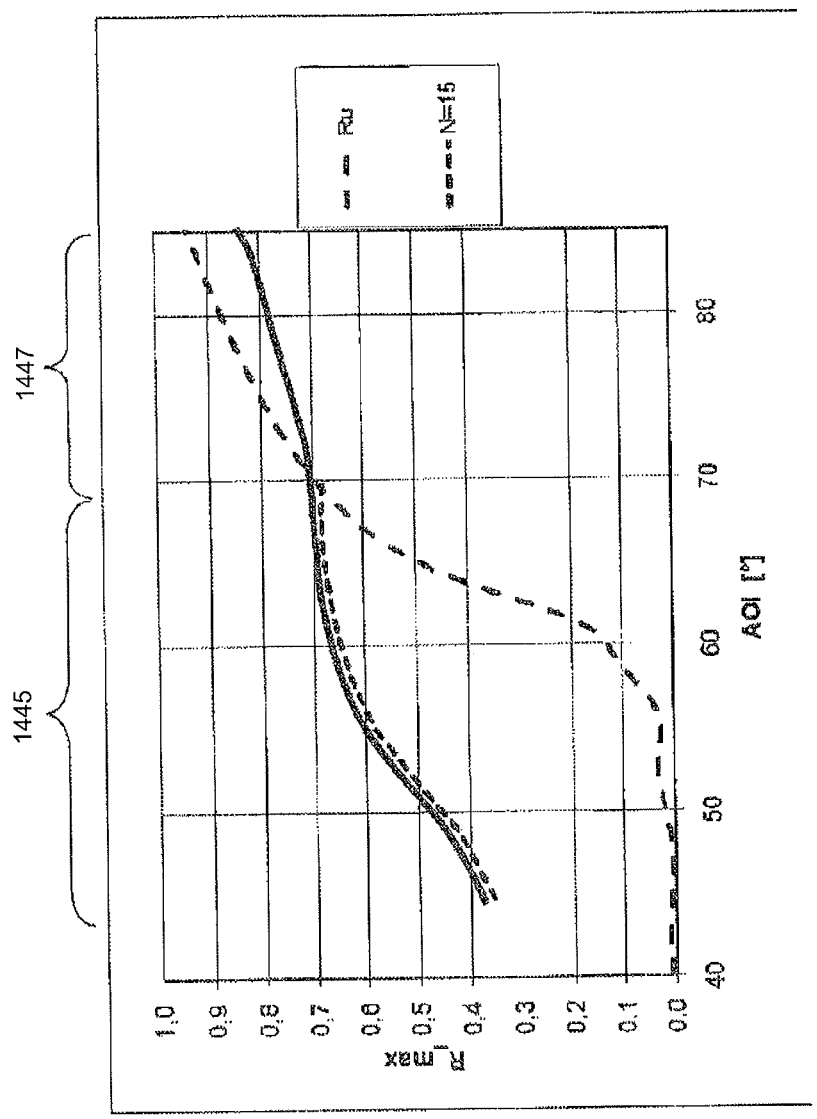
FIG. 14 shows a reflection curve of a coating with continuous ruthenium layer and absorber layer and multilayer in locally delimited region.

A reflection curve as shown in FIG. 14 results for the exemplary embodiment from FIG. 13. A first region 1445 corresponds to the reflectivity at average angles of incidence of less than 70°. This first region is produced by the first layer system. In a second region 1447, the reflection curve such as results for a single layer without an absorbent layer is shown in a dashed fashion. A solid line represents the reflectivity with an absorbent layer 1343 on the second layer system 1331. The solid line exhibits a flat profile in the entire angle-of-incidence range 1445 and 1447.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, and wherein the layer system is designed such that, for light having a wavelength of less than 30 nm and for any two angles of incidence of between 55° and 70°, the variation of the reflectivity is less than 20%, wherein the layer system has local thicknesses and the minimum local thickness of the layer system deviates from the maximum local thickness of the layer system by at least 1% of the minimum local thickness, and wherein the local thicknesses in the layer system increase as the angle of incidence increases.

2. The deflection mirror as claimed in claim 1, wherein the layer system is designed such that, for light having a wavelength of less than 30 nm and for angles of incidence of greater than 55°, a reflectivity of at least 30% is achieved.

3. The deflection mirror as claimed in claim 1, wherein the reflectivity of the mirror, depending on the angle of incidence, for all angles of incidence of greater than 65°, particularly preferably greater than 60°, increases monotonically as the angle of incidence increases.

4. The deflection mirror as claimed in claim 1, wherein the layer system consists of a sequence of high refractive index and low refractive index materials which are selected or combined as a compound from the group of materials: ruthenium, silicon and molybdenum.

5. The deflection mirror as claimed in claim 1, wherein the layer system consists of a sequence of high refractive index and low refractive index materials and the high refractive index and low refractive index materials are separated by at least one barrier layer consisting of materials which are selected or combined as a compound from the group of materials: molybdenum, silicon, B4C, C, Si nitride, Si carbide, Si boride, Mo nitride, Mo carbide, Mo boride, Ru nitride, Ru carbide and Ru boride.

6. The deflection mirror as claimed in claim 1, wherein the layer system comprises layers and the layer of the layer system at the greatest distance from the substrate is a capping layer comprised of a chemically inactive material.

7. A deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, and wherein the layer system is designed such that, for light having a wavelength of less than 30 nm and for any two angles of incidence of between 55° and 70°, the variation of the reflectivity is less than 20%, wherein the layer system has local thicknesses and the minimum local thickness of the layer system deviates from the maximum local thickness of the layer system by at least 1% of the minimum local thickness, wherein the local thicknesses in the layer system increase as the angle of incidence increases, wherein the at least one layer system comprises a first layer system and a second layer system, and wherein the second layer system is applied on the substrate laterally alongside the first layer system.

8. The deflection mirror as claimed in claim 7, wherein the second layer system consists of a single layer of a material selected from the group ruthenium, gold, rhodium and palladium.

9. The deflection mirror as claimed in claim 7, wherein the first layer system comprises a number n of layers, and wherein the second layer system comprises at least n−1 layers of the first layer system.

10. The deflection mirror as claimed in claim 7, wherein, upon use in a microlithography projection exposure apparatus, the first layer system is applied in a first region of the deflection layer, in which all angles of incidence are less than a limiting angle, and the second layer system is applied in a second region, in which all angles of incidence are greater than the limiting angle.

11. The deflection mirror as claimed in claim 10, wherein the limiting angle is greater than 65°.

12. The deflection mirror as claimed in claim 7, wherein the reflectivity of the first layer system deviates from the reflectivity of the second layer system by less than 10% for all rays having angles of incidence of greater than 60° and less than 75°.

13. The deflection mirror as claimed in claim 7, wherein the layer of the second layer system which is furthest away from the substrate is selected or combined as a compound from the group of materials: Cr, TiN, TaN, TaBN, CrN, Mo, Au, Ir, Ni, Cu, Co, and Pt.

14. An illumination optical unit for a microlithography projection exposure apparatus comprising at least one optical element having reflective facet elements and a deflection mirror as claimed in claim 1, wherein the deflection mirror deflects the light prepared by the facet elements with grazing incidence onto an object field in an object plane of the projection exposure apparatus, to provide a homogeneous illumination of the object field.

15. The illumination optical unit as claimed in claim 14, wherein the deflection mirror is a plane mirror and is situated as the last mirror of the illumination optical unit directly upstream of the object plane of the projection exposure apparatus.

16. The projection exposure apparatus for use in microlithography comprising at least one deflection mirror as claimed in claim 1.

17. The deflection mirror as claimed in claim 1, wherein the variation of the reflectivity is less than 12%.

18. The deflection mirror as claimed in claim 1, wherein the layer system has local thicknesses and the minimum local thickness of the layer system deviates from the maximum local thickness of the layer system by at least 10% of the minimum local thickness.

19. A deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, wherein the layer system is designed such that, for light having a wavelength of less than 30 nm, for all angles of incidence of greater than 55°, a reflectivity of at least 30% is achieved, wherein the layer system has local thicknesses and the minimum local thickness of the layer system deviates from the maximum local thickness of the layer system by at least 1% of the minimum local thickness, and wherein the local thicknesses in the layer system increase as the angle of incidence increases.

20. A deflection mirror for a microlithography projection exposure apparatus for illuminating an object field in an object plane of the projection exposure apparatus using the deflection mirror with grazing incidence, comprising a substrate and at least one layer system, wherein during operation light impinges on the deflection mirror at a multiplicity of angles of incidence, and wherein the layer system is designed such that, for light having a wavelength of less than 30 nm and for any two angles of incidence of between 55° and 70°, the variation of the reflectivity is less than 20%, wherein the at least one layer system comprises a first layer system and a second layer system;

wherein the second layer system is applied on the substrate laterally alongside the first layer system; and wherein a boundary line between the first layer system and the second layer system falls within a region of the mirror in which the intensity of the used radiation that is incident during operation is a maximum of 10% of the intensity of the used radiation that is maximally incident on the deflection mirror.

* * * * *